(12) United States Patent
Haneda et al.

(10) Patent No.: US 11,539,327 B2
(45) Date of Patent: Dec. 27, 2022

(54) CIRCUIT DEVICE AND OSCILLATOR

(71) Applicant: Seiko Epson Corporation, Tokyo (JP)

(72) Inventors: Hideo Haneda, Shiojiri (JP); Yuichi Toriumi, Minowa (JP); Teppei Higuchi, Chino (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/488,357

(22) Filed: Sep. 29, 2021

(65) Prior Publication Data

US 2022/0103125 A1 Mar. 31, 2022

(30) Foreign Application Priority Data

Sep. 30, 2020 (JP) .............................. JP2020-165276

(51) Int. Cl.
*H03B 5/04* (2006.01)
*H03B 5/32* (2006.01)

(52) U.S. Cl.
CPC .............. *H03B 5/04* (2013.01); *H03B 5/326* (2013.01)

(58) Field of Classification Search
CPC ....................................................... H03B 5/04
USPC .......................................................... 331/66
See application file for complete search history.

(56) References Cited

U.S. PATENT DOCUMENTS 5,691,671 A * 11/1997 Bushman ................ H03L 1/022
331/158
2002/0005765 A1 * 1/2002 Ashley .................... H03L 1/026
331/158

FOREIGN PATENT DOCUMENTS

JP 2007-067675 A 3/2007

* cited by examiner

*Primary Examiner* — Joseph Chang
(74) *Attorney, Agent, or Firm* — Harness, Dickey & Pierce, P.L.C.

(57) ABSTRACT

A circuit device includes an oscillation circuit that generates an oscillation signal by using a vibrator, a frequency adjustment circuit that adjusts an oscillation frequency of the oscillation circuit based on frequency adjustment data, a temperature sensor circuit that outputs temperature data, an arithmetic operation circuit, and a storage circuit. The arithmetic operation circuit outputs converted temperature data by performing, on the temperature data, conversion processing in which a slope of the converted temperature data with respect to the temperature data in a first temperature range is different from a slope of the converted temperature data with respect to the temperature data in a second temperature range. The storage circuit stores a lookup table representing a correspondence between the converted temperature data and the frequency adjustment data.

12 Claims, 10 Drawing Sheets

CIRCUIT DEVICE AND OSCILLATOR

The present application is based on, and claims priority from JP Application Serial Number 2020-165276, filed Sep. 30, 2020, the disclosure of which is hereby incorporated by reference herein in its entirety.

BACKGROUND

1. Technical Field

The present disclosure relates to a circuit device, an oscillator, and the like.

2. Related Art

JP-A-2007-67675 describes a temperature-compensated oscillation circuit including a temperature measurement unit that outputs a temperature measurement result as a digital signal, a counter that outputs a higher bit of the digital signal as an address value, a storage unit that outputs a correction value corresponding to the address value, and a capacitance array that adjusts an oscillation frequency by being set to a capacitance value corresponding to the correction value.

In JP-A-2007-67675, since the higher bit of the digital signal is used as the address value, the address value corresponds to a temperature point at a substantially constant temperature interval. That is, the correction value corresponding to the temperature point at the substantially constant temperature interval is stored in the storage unit, and temperature sensitivity in temperature characteristics of the oscillation frequency is not taken into consideration. Thus, there is a problem that utilization efficiency of a memory is lowered in a temperature range in which the temperature sensitivity is low, while accuracy of temperature compensation is lowered in a temperature range in which the temperature sensitivity is high.

SUMMARY

One aspect of the present disclosure relates to a circuit device including an oscillation circuit that generates an oscillation signal by using a vibrator, a frequency adjustment circuit that adjusts an oscillation frequency of the oscillation circuit based on frequency adjustment data, a temperature sensor circuit that outputs temperature data, an arithmetic operation circuit that outputs converted temperature data by performing, on the temperature data, conversion processing in which a slope of the converted temperature data with respect to the temperature data in a first temperature range is different from a slope of the converted temperature data with respect to the temperature data in a second temperature range, and a storage circuit that stores a lookup table representing a correspondence between the converted temperature data and the frequency adjustment data.

Another aspect of the present disclosure relates to an oscillator including the circuit device described above and the vibrator.

DESCRIPTION OF EXEMPLARY EMBODIMENTS

Hereinafter, a preferred embodiment of the present disclosure will be described in detail. It should be noted that the present embodiment to be described below does not unreasonably limit the contents described in the appended claims, and not all configurations to be described in the present embodiment are essential constituent requirements.

1. Circuit Device and Oscillator

Figure 1:
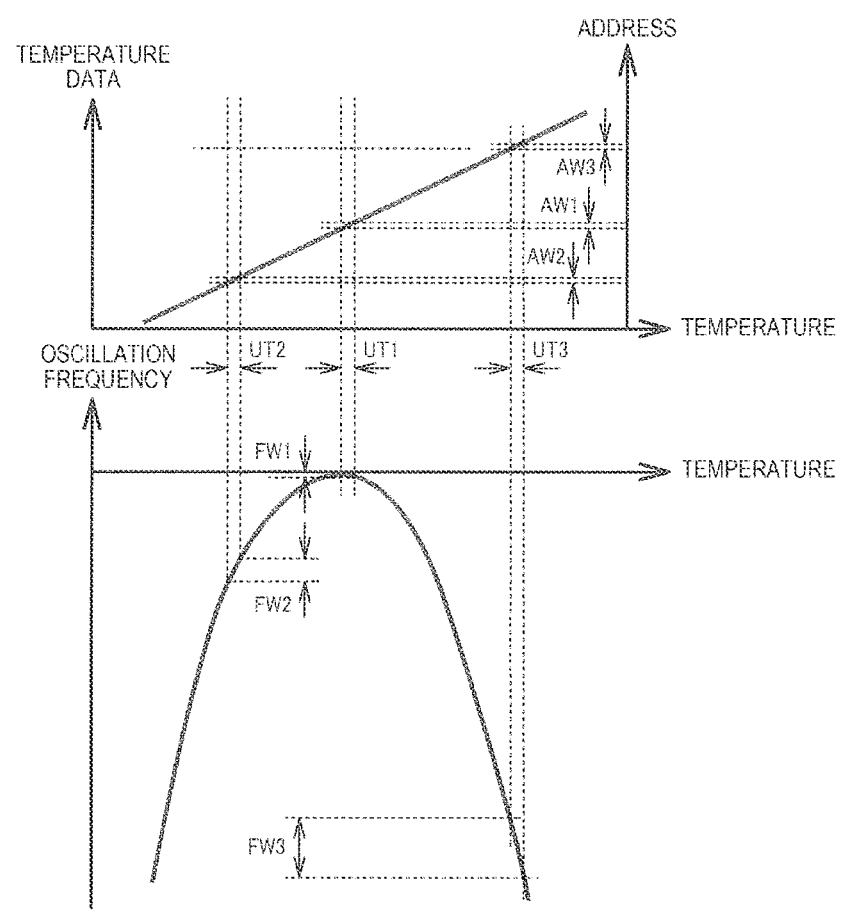
FIG. 1 illustrates a relationship between temperature characteristics of an oscillation frequency and address allocation when temperature data output by a temperature sensor is used as it is as an address of a lookup table.

FIG. 1 illustrates a relationship between temperature characteristics of an oscillation frequency and address allocation when temperature data output by a temperature sensor is used as it is as an address of a lookup table. Here, although an example in which the temperature data is linear with respect to a temperature is illustrated, the temperature data may be approximately linear with respect to the temperature. Although an example in which the temperature characteristics of the oscillation frequency is a quadratic function of the temperature is illustrated, the temperature characteristics may be temperature characteristics that the temperature sensitivity of the oscillation frequency changes according to the temperature.

The temperature characteristics illustrated in FIG. 1 are convex secondary characteristics that have a peak near a room temperature. UT1 to UT3 are temperature ranges in a unit temperature range. The temperature range UT1 is near the room temperature, and a frequency change amount FW1 per unit temperature is small. The temperature range UT2 is a little far from the room temperature, and a frequency change amount FW2 per unit temperature is about medium. The temperature range UT3 is further away from room temperature than the temperature range UT2, and a frequency change amount FW3 per unit temperature is large. The frequency change amount per unit temperature corresponds to the temperature sensitivity of the oscillation frequency, and means that the temperature sensitivity increases as the temperature range from the room temperature increases.

The temperature ranges UT1 to UT3 of the unit temperature range correspond to address ranges AW1 to AW3 of the lookup table, and the frequency change amounts FW1 to FW3 per unit temperature are allocated to the address ranges AW1 to AW3. Since the temperature data is linear, since the address ranges AW1 to AW3 have the same number of addresses, a frequency change amount per address is small in the temperature range UT1 and is large in the temperature range UT3.

In order to realize highly accurate temperature compensation while efficiently using a memory having a finite capacity, it is desirable that the frequency change amount per address is uniform. However, as described above, the address allocation is excessive in the temperature range UT1, and the address allocation is insufficient in the temperature range UT3. For example, when the number of addresses per unit temperature is reduced, the allocation of the temperature range UT1 can be optimized. However, in the temperature range UT3, since the frequency change per address becomes large, the accuracy of the temperature compensation is lowered. On the other hand, when the number of addresses per unit temperature is increased, the accuracy of the temperature compensation in the temperature range UT3 can be improved. However, in the temperature range UT1, although the frequency change is small, the number of allocated addresses increases, the utilization efficiency of the memory is lowered. As described above, when the temperature data output by the temperature sensor is used as it is as the address of the lookup table, there is a problem that it is difficult to realize highly accurate temperature compensation while efficiently using a memory of a finite capacity.

Figure 2:
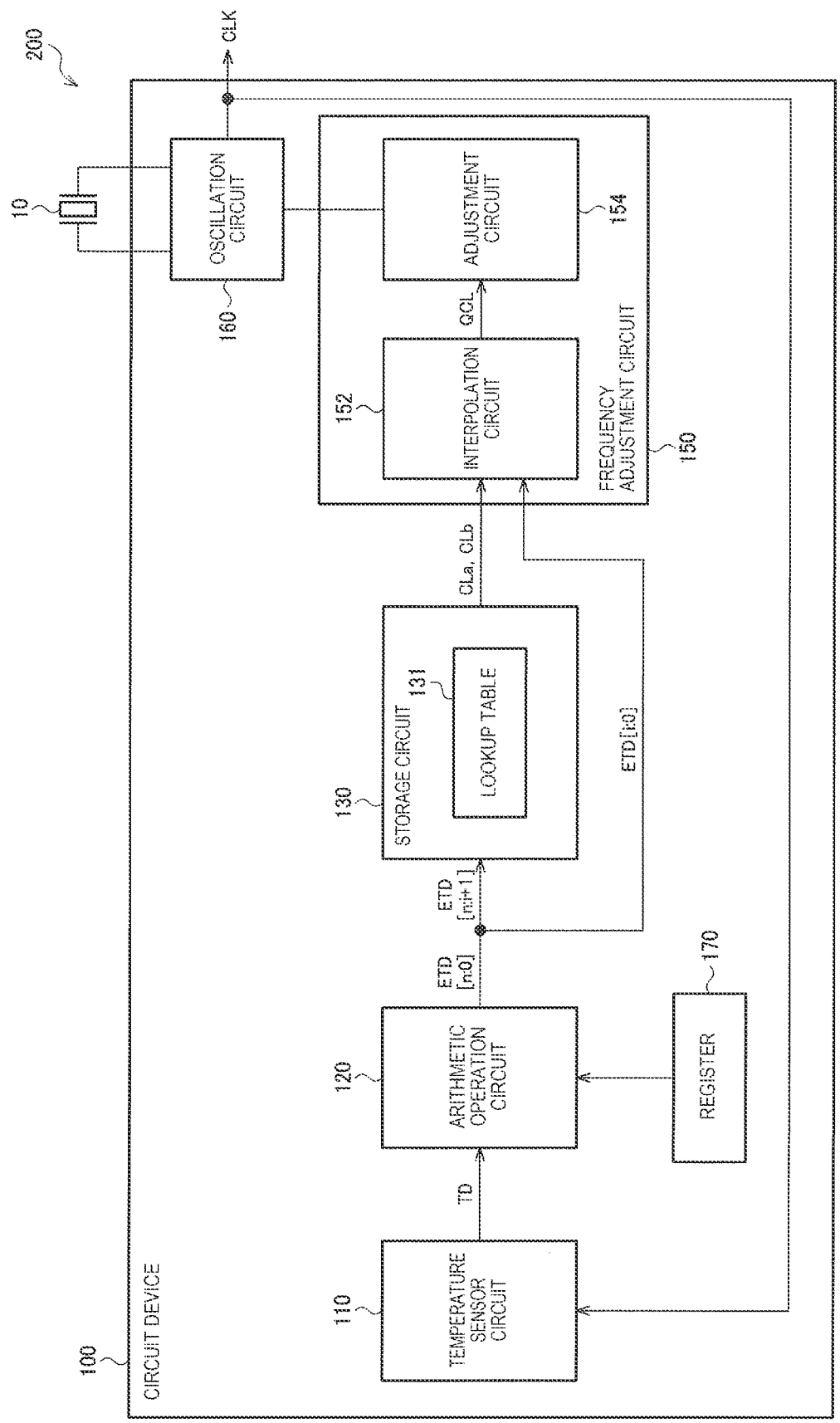
FIG. 2 illustrates a configuration example of an oscillator and a circuit device.

FIG. 2 illustrates a configuration example of an oscillator 200 and a circuit device 100 according to the present embodiment. The oscillator 200 includes a vibrator 10 and the circuit device 100.

The vibrator 10 is an element that generates mechanical vibration by an electric signal. The vibrator 10 can be realized by a vibrator element such as a quartz crystal vibrator element. For example, the vibrator 10 is a tuning fork type quartz crystal vibrator element. Alternatively, the vibrator 10 can be realized by a quartz crystal vibrator element having a cut angle of AT cut, SC cut, or the like that vibrates in a thickness-shear mode. The vibrator 10 of the present embodiment can be realized by various vibrator elements such as a vibrator element other than the tuning fork type or thickness-shear vibration type or a piezoelectric vibrator element made of a material other than quartz crystal. For example, a SAW resonator or a MEMS vibrator as a silicon vibrator formed by using a silicon substrate may be adopted as the vibrator 10. SAW is an abbreviation for Surface Acoustic Wave, and MEMS is an abbreviation for Micro Electro Mechanical Systems.

The circuit device 100 is electrically coupled to the vibrator 10 and drives the vibrator 10 to oscillate the vibrator 10. The coupling in the present embodiment is an electrical coupling. The electrical coupling is a coupling in which an electric signal can be transmitted, and is a coupling in which information can be transmitted by the electric signal. The electrical coupling may be a coupling via a passive element, an active element, or the like. The circuit device 100 performs temperature compensation processing of setting the oscillation frequency of the oscillator 200 to be constant regardless of the temperature. The circuit device 100 is an integrated circuit device called an IC. The circuit device 100 is an IC manufactured by a semiconductor process, and is a semiconductor chip in which a circuit element is formed on a semiconductor substrate.

The circuit device 100 includes a temperature sensor circuit 110, an arithmetic operation circuit 120, a storage circuit 130, a frequency adjustment circuit 150, an oscillation circuit 160, and a register 170. The present embodiment is not limited to the configuration of FIG. 2, and various modifications such as omission of a part of constituent elements or addition of other constituent elements can be performed.

The temperature sensor circuit 110 measures an environmental temperature of the vibrator 10 and outputs the result as temperature data TD. The temperature data TD is data that monotonically increases or decreases with respect to the temperature in an operating temperature range of the circuit device 100. As will be described later, the temperature sensor circuit 110 is a temperature sensor that utilizes the fact that an oscillation frequency of a ring oscillator has temperature dependence. In this case, the temperature sensor circuit 110 includes a ring oscillator and a counter. The counter counts an oscillation signal of the ring oscillator in an enable period defined by a clock signal CLK output by the oscillation circuit 160, and outputs the count value as the temperature data TD. However, the temperature sensor circuit 110 is not limited thereto, and may include, for example, an analog temperature sensor that outputs a temperature detection voltage by utilizing the fact that a forward voltage of a PN junction has temperature dependence, and an A/D converter that performs A/D conversion on the temperature detection voltage and outputs the temperature data TD.

The arithmetic operation circuit 120 is a logic circuit that converts the temperature data TD output by the temperature sensor circuit 110 into converted temperature data ETD. Although the converted temperature data ETD is data that monotonically increases or decreases with respect to the temperature like the temperature data TD, a slope of the converted temperature data ETD is converted from a slope of the temperature data TD according to the temperature range. Hereinafter, it is assumed that n is an integer of 1 or more and the converted temperature data ETD is (n+1) bit data ETD [n: 0].

The register 170 stores parameters of the conversion performed by the arithmetic operation circuit 120. The parameters stored in the register 170 are input to the arithmetic operation circuit 120, and the arithmetic operation circuit 120 converts the temperature data TD into the converted temperature data ETD [n: 0] based on the parameters.

The storage circuit 130 stores a lookup table 131 representing a correspondence between the converted temperature data ETD [n: 0] and frequency adjustment data. Specifically, a higher bit ETD [n: i+1] of the converted temperature data ETD [n: 0] is input, as the address of the lookup table 131, to the storage circuit 130. i is an integer of 1 or more and n or less. The lookup table 131 stores the frequency adjustment data at each address, and the storage circuit 130 outputs frequency adjustment data CLa of an address designated by the higher bit ETD [n: i+1] and frequency adjustment data CLb of a next address. The storage circuit 130 is, for example, a non-volatile memory or a semiconductor memory such as RAM, or a register including a latch circuit or the like. Although the non-volatile memory is, for example, an OTP memory such as a FAMOS memory, the non-volatile memory is not limited thereto, and may be an EEPROM such as a MONOS memory or a fuse type ROM. FAMOS is an abbreviation for Floating gate Avalanche injection Metal Oxide Semiconductor. MONOS is an abbreviation for Metal-Oxide-Nitride-Oxide-Silicon.

The frequency adjustment circuit 150 adjusts an oscillation frequency of the oscillation circuit 160 based on a lower bit ETD [i: 0] of the converted temperature data ETD [n: 0] and the pieces of frequency adjustment data CLa and CLb. Specifically, the frequency adjustment circuit 150 includes an interpolation circuit 152 and an adjustment circuit 154.

The interpolation circuit 152 outputs adjustment data QCL by interpolating of the frequency adjustment data CLa and the frequency adjustment data CLb based on the lower bit ETD [i: 0] of the converted temperature data ETD [n: 0]. The adjustment circuit 154 is coupled to the oscillation circuit 160, the oscillation frequency of the oscillation circuit is adjusted to an oscillation frequency corresponding to the adjustment data QCL. The frequency adjustment data stored in the lookup table 131 is data that reduces the temperature dependence of the oscillation frequency of the oscillation circuit 160 and the vibrator 10. The oscillation frequency is adjusted by using the frequency adjustment data, and thus, the oscillation frequency becomes constant regardless of the temperature. The adjustment circuit 154 is a capacitor array circuit coupled to one end or the other end of the vibrator 10, as will be described later. Alternatively, the adjustment circuit 154 may include a D/A converter that performs D/A conversion on the adjustment data QCL, and a variable capacitance capacitor coupled to one end or the other end of the vibrator 10. A capacitance value of the variable capacitance capacitor is controlled according to an output voltage of the D/A converter.

The frequency adjustment circuit 150 is not limited to the configuration of FIG. 2, and the interpolation circuit 152 may be omitted, for example. In this case, the storage circuit 130 outputs the frequency adjustment data CLa corresponding to the converted temperature data ETD [n: 0], and the adjustment circuit 154 adjusts the oscillation frequency of the oscillation circuit to an oscillation frequency corresponding to the frequency adjustment data CLa.

The oscillation circuit 160 generates an oscillation signal by using the vibrator 10. Specifically, the oscillation circuit 160 oscillates the vibrator 10 by driving the vibrator 10, and generates an oscillation signal by the oscillation. Although an example of the oscillation circuit 160 is a Colpitts type oscillation circuit to be described later, the oscillation circuit is not limited thereto, and various types of oscillation circuits may be used as long as the oscillation frequency can be adjusted by the frequency adjustment circuit 150. The clock signal CLK is output based on the oscillation signal. For example, the oscillation circuit 160 may output the oscillation signal as the clock signal CLK, or the circuit device 100 may include an output circuit that outputs the clock signal CLK by buffering or dividing the oscillation signal.

Figure 3:
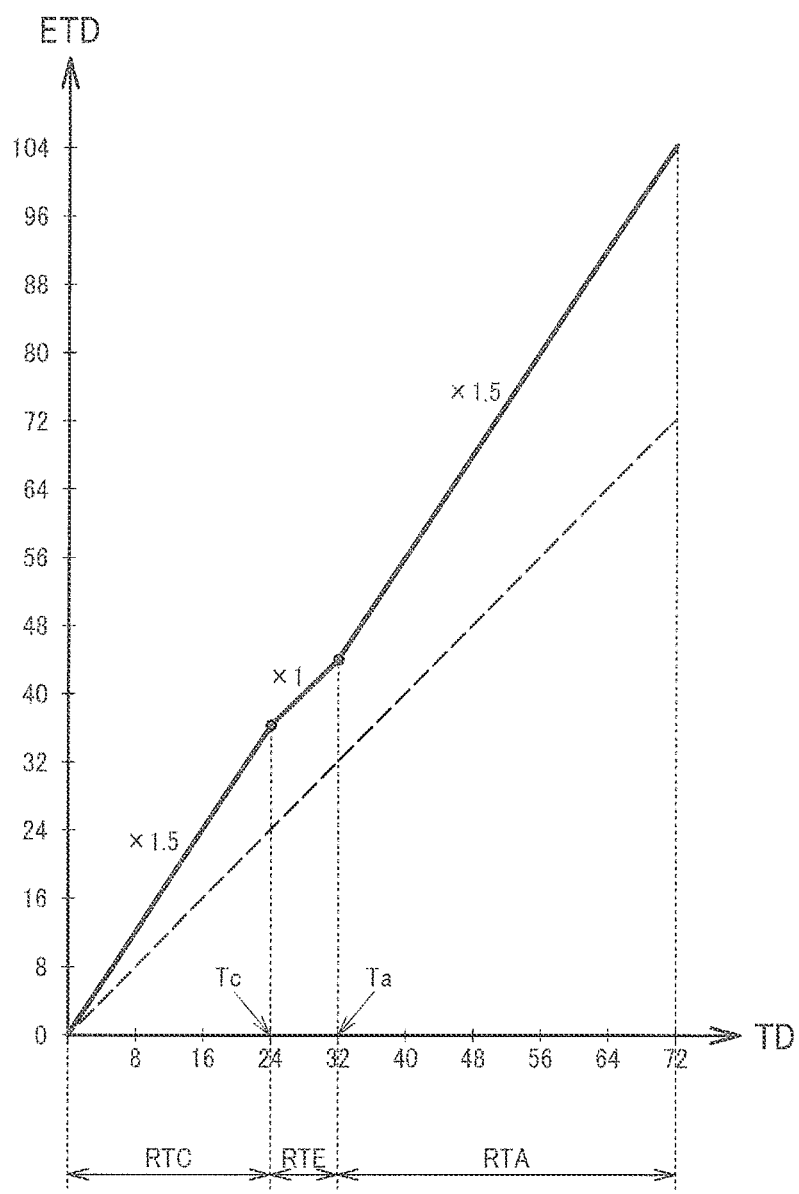
FIG. 3 illustrates an example of conversion from temperature data to converted temperature data in a first configuration example of an arithmetic operation circuit.

FIG. 3 is an example of conversion from the temperature data TD to the converted temperature data ETD in a first configuration example of the arithmetic operation circuit 120. A solid line depicts the converted temperature data ETD in the present embodiment, and a dotted line depicts the converted temperature data ETD when the temperature data TD is used as it is as the converted temperature data ETD. In FIG. 3, the temperature data TD and the converted temperature data ETD are represented by decimal numbers. The higher bit ETD [n: i+1] of the converted temperature data ETD is represented as an integer, and one integer value corresponds to one address.

In FIG. 3, as a value of the temperature data TD becomes larger, the larger value corresponds to a higher temperature, and a range of 0 to 72 of the temperature data TD corresponds to the operating temperature range of the circuit device 100. In the first configuration example, the operating temperature range is divided into a temperature range RTC corresponding to the range of 0 to 24 of the temperature data TD, a temperature range RTE corresponding to the range of 24 to 32 of the temperature data TD, and a temperature range RTA corresponding to the range of 32 to 72 of the tempera-ture data TD. The temperature range RTE is near the room temperature, and is a temperature range in which the temperature sensitivity is small in terms of the temperature characteristics of the oscillation frequency. The temperature ranges RTC and RTA are temperature ranges in which the temperature sensitivity is higher than the room temperature in terms of the temperature characteristics of the oscillation frequency.

The arithmetic operation circuit 120 outputs the converted temperature data ETD by not changing the slope of the temperature data TD corresponding to the temperature range RTE near the room temperature and performing offset addition processing on the temperature data TD. The arithmetic operation circuit 120 outputs the converted temperature data ETD by multiplying the slopes of the pieces of temperature data TD corresponding to the temperature ranges RTC and RTA of which the temperature sensitivity is large by 1.5 and performing the offset addition processing. An offset value to be added in the offset addition processing is set such that a lower limit of the converted temperature data ETD in the operating temperature range does not become negative. In FIG. 3, the offset value is set such that the lower limit of the converted temperature data ETD becomes zero, but the offset value may be set such that the lower limit of the converted temperature data ETD becomes larger than zero. The offset value is EQOF to be described later in FIG. 4.

In the above embodiment, the circuit device 100 includes the oscillation circuit 160 that generates the oscillation signal by using the vibrator 10, the frequency adjustment circuit 150 that adjusts the oscillation frequency of the oscillation circuit 160 based on the pieces of frequency adjustment data CLa and CLb, the temperature sensor circuit 110 that outputs the temperature data TD, the arithmetic operation circuit 120, and the storage circuit 130. The arithmetic operation circuit 120 output the converted temperature data ETD by performing, on the temperature data TD, conversion processing in which the slope of the converted temperature data ETD with respect to the temperature data TD in a first temperature range is different from the slope of the converted temperature data ETD with respect to the temperature data TD in a second temperature range. The storage circuit 130 stores the lookup table 131 representing the correspondence between the converted temperature data ETD and the pieces of frequency adjustment data CLa and CLb.

In the example of FIG. 3, the temperature range RTA or RTC corresponds to the first temperature range and the temperature range RTE corresponds to the second temperature range. The slope of the converted temperature data ETD is 1.5 in the temperature ranges RTA and RTC, and the slope of the converted temperature data ETD is 1 in the temperature range RTE. That is, the slope in the first temperature range and the slope in the second temperature range are different.

According to the present embodiment, the temperature data TD is converted into the converted temperature data ETD such that the slope of the converted temperature data ETD differs depending on the temperature range. Accordingly, it is possible to adjust the slope of the converted temperature data ETD according to the temperature sensitivity in the temperature characteristics of the oscillation frequency. Specifically, an absolute value of the slope of the converted temperature data ETD can be increased in the temperature range in which the temperature sensitivity is high, and an absolute value of the slope of the converted temperature data ETD can be decreased in the temperature range in which the temperature sensitivity is low. Since the address of the lookup table 131 is designated by the converted temperature data ETD, as the absolute value of the slope of the converted temperature data ETD becomes larger, the number of addresses per unit temperature becomes larger. Accordingly, since the address allocation per unit temperature can be increased in the temperature range in which the temperature sensitivity is high and the address allocation per unit temperature can be decreased in the temperature range in which the temperature sensitivity is low, highly accurate temperature compensation can be achieved while efficiently utilizing a memory having a finite capacity.

In the present embodiment, the arithmetic operation circuit 120 outputs the converted temperature data ETD such that the number of pieces of data per unit temperature of the frequency adjustment data output from the lookup table 131 by the converted temperature data ETD corresponding to the first temperature range is different from the number of pieces of data per unit temperature of the frequency adjustment data output from the lookup table 131 by the converted temperature data ETD corresponding to the second temperature range.

As described above, as the absolute value of the slope of the converted temperature data ETD becomes larger, the number of addresses per unit temperature becomes larger. Thus, the number of pieces of data per unit temperature of the frequency adjustment data output from the lookup table 131 by the converted temperature data ETD becomes large. As the number of pieces of data per unit temperature becomes larger, the frequency adjustment data is stored in the lookup table 131 in smaller temperature increments. Thus, highly accurate temperature compensation can be performed even in the temperature range in which the temperature sensitivity is high. On the other hand, as the number of pieces of data per unit temperature becomes smaller, the frequency adjustment data is stored in the lookup table 131 in larger temperature increments. Thus, the utilization efficiency of the memory is improved in the temperature range in which the temperature sensitivity is small.

Figure 4:
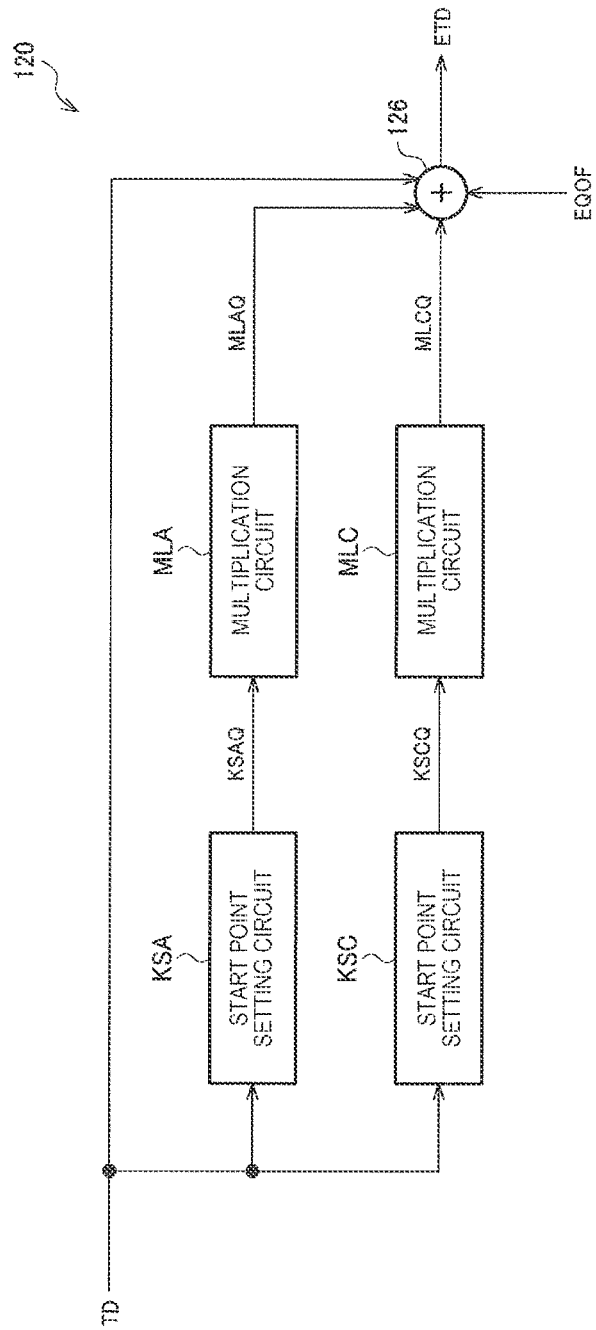
FIG. 4 illustrates the first configuration example of the arithmetic operation circuit.

FIG. 4 illustrates the first configuration example of the arithmetic operation circuit 120 that performs the conversion of FIG. 3. The arithmetic operation circuit 120 includes start point setting circuits KSA and KSC, multiplication circuits MLA and MLC, and an addition circuit 126.

The start point setting circuit KSA sets a start temperature Ta of the temperature range RTA of FIG. 3. The start temperature Ta is a boundary between the adjacent temperature ranges RTE and RTA, and is a lower limit of the temperature range RTA. Specifically, the start temperature Ta is set by the temperature data TD=32 corresponding to the start temperature Ta. The start point setting circuit KSA outputs difference temperature data KSAQ=TD−32 obtained by subtracting 32 from the temperature data TD when the temperature data TD is equal to or larger than 32, and outputs the difference temperature data KSAQ=0 when the temperature data TD is smaller than 32. The multiplication circuit MLA outputs output data MLAQ=KSAQ×0.5=(TD−32)×0.5 obtained by multiplying the difference temperature data KSAQ by a gain of 0.5. MLAQ=0 when TD<32.

The start point setting circuit KSC sets a start temperature Tc of the temperature range RTC of FIG. 3. The start temperature Tc is a boundary between the adjacent temperature ranges RTE and RTC, and is an upper limit of the temperature range RTC. Specifically, the start temperature Tc is set by the temperature data TD=24 corresponding to the start temperature Tc. The start point setting circuit KSC outputs the difference temperature data KSCQ=−(TD−24) in which 24 is subtracted from the temperature data TD and a sign is inverted when the temperature data TD is equal to or less than 24, and outputs the difference temperature data KSCQ=0 when the temperature data TD is larger than 24. The multiplication circuit MLC outputs output data MLCQ=−(KSCQ×0.5)=(TD−24)×0.5 in which the difference temperature data KSCQ is multiplied by a gain of 0.5 and a sign is inverted. MLCQ=0 when TD>24.

The addition circuit 126 adds the temperature data TD, the output data MLAQ, the output data MLCQ, and the offset value EQOF, and outputs the result as the converted temperature data ETD. In the temperature range RTE, ETD=TD+EQOF, and the slope of the converted temperature data ETD is 1. In the temperature range RTA, ETD=TD+(TD−32)×0.5+EQOF=1.5×TD−16+EQOF, and in the temperature range RTC, ETD=TD+(TD−24)×0.5+EQOF=1.5×TD−12+EQOF. Since a coefficient of the temperature data TD is 1.5 obtained by adding 1 to the gain of 0.5, the slope of the converted temperature data ETD is 1.5. The offset value EQOF is set such that the lower limit of the converted temperature data ETD in the operating temperature range does not become negative. That is, the offset value EQOF is set such that the lower limit of the converted temperature data ETD is zero or is larger than zero.

In the present embodiment, the arithmetic operation circuit 120 multiplies the temperature data TD of the first temperature range by a first coefficient, and does not multiply the temperature data TD of the second temperature range by the coefficient.

In the example of FIG. 3, the temperature range RTA or RTC corresponds to the first temperature range and the temperature range RTE corresponds to the second temperature range. As described with reference to FIGS. 3 and 4, the arithmetic operation circuit 120 multiplies the pieces of temperature data TD of the temperature ranges RTA and RTC by a coefficient of 1.5, and does not multiply the pieces of temperature data TD of the temperature range RTE by the coefficient. In this example, the coefficient of 1.5 corresponds to the first coefficient.

According to the present embodiment, the slope of the converted temperature data ETD in the first temperature range is set by the first coefficient, and the slope of the converted temperature data ETD in the second temperature range is 1. Accordingly, the arithmetic operation circuit 120 can execute the conversion processing in which the slope of the converted temperature data ETD in the first temperature range is different from the slope of the converted temperature data ETD in the second temperature range.

In the present embodiment, an absolute value of a slope of frequency-temperature characteristics of the vibrator 10 in the first temperature range is larger than an absolute value of a slope of frequency-temperature characteristics in the second temperature range. At this time, the first coefficient is larger than 1. The frequency-temperature characteristics are temperature characteristics of the oscillation frequency. The absolute value of the slope of the frequency-temperature characteristics corresponds to the temperature sensitivity of the frequency-temperature characteristics.

In the example of FIG. 3, the temperature range RTE corresponding to the second temperature range corresponds to a range near the room temperature at which the absolute value of the slope of the frequency-temperature characteristics is small in FIG. 1. The temperature range RTA or RTC corresponding to the first temperature range corresponds to a temperature range in which the absolute value of the slope of the frequency-temperature characteristics is larger than the range near the room temperature in FIG. 1.

According to the present embodiment, since the temperature data TD of the first temperature range in which the absolute value of the slope of the frequency-temperature characteristics is large is multiplied by the first coefficient larger than 1, the absolute value of the slope of the converted temperature data ETD of the first temperature range is larger than 1. Accordingly, the address allocation of the lookup table 131 can be increased in the temperature range in which the absolute value of the slope of the frequency-temperature characteristics is large.

In the present embodiment, the first temperature range is a temperature range adjacent to the second temperature range and higher than the second temperature range. The arithmetic operation circuit 120 includes the first start point setting circuit that sets the first start temperature in the first temperature range, the first multiplication circuit that multiplies the difference temperature data KSAQ indicating an increase in the temperature data TD with respect to the temperature data TD at the first start temperature by the first gain, and the addition circuit 126 that adds the temperature data TD and the output of the first multiplication circuit.

In the example of FIG. 3, the temperature range RTA corresponds to the first temperature range, the temperature range RTE corresponds to the second temperature range, the start temperature Ta corresponds to the first start temperature, and TD=32 corresponds to the temperature data TD at the first start temperature. In FIG. 4, the start point setting circuit KSA corresponds to the first start point setting circuit, the multiplication circuit MLA corresponds to the first multiplication circuit, and the gain of 0.5 corresponds to the first gain.

According to the present embodiment, a case where the temperature data TD corresponding to the temperature higher than the first start temperature is multiplied by the first gain and the temperature data TD is added to the multiplied data is equivalent to a case where the temperature data TD of the first temperature range is multiplied by the first coefficient. That is, the first coefficient is a value obtained by adding 1 to the first gain. Since the temperature data TD of the second temperature range is merely output as the converted temperature data ETD from the addition circuit 126, the temperature data TD of the second temperature range is not multiplied by the coefficient.

Figure 5:
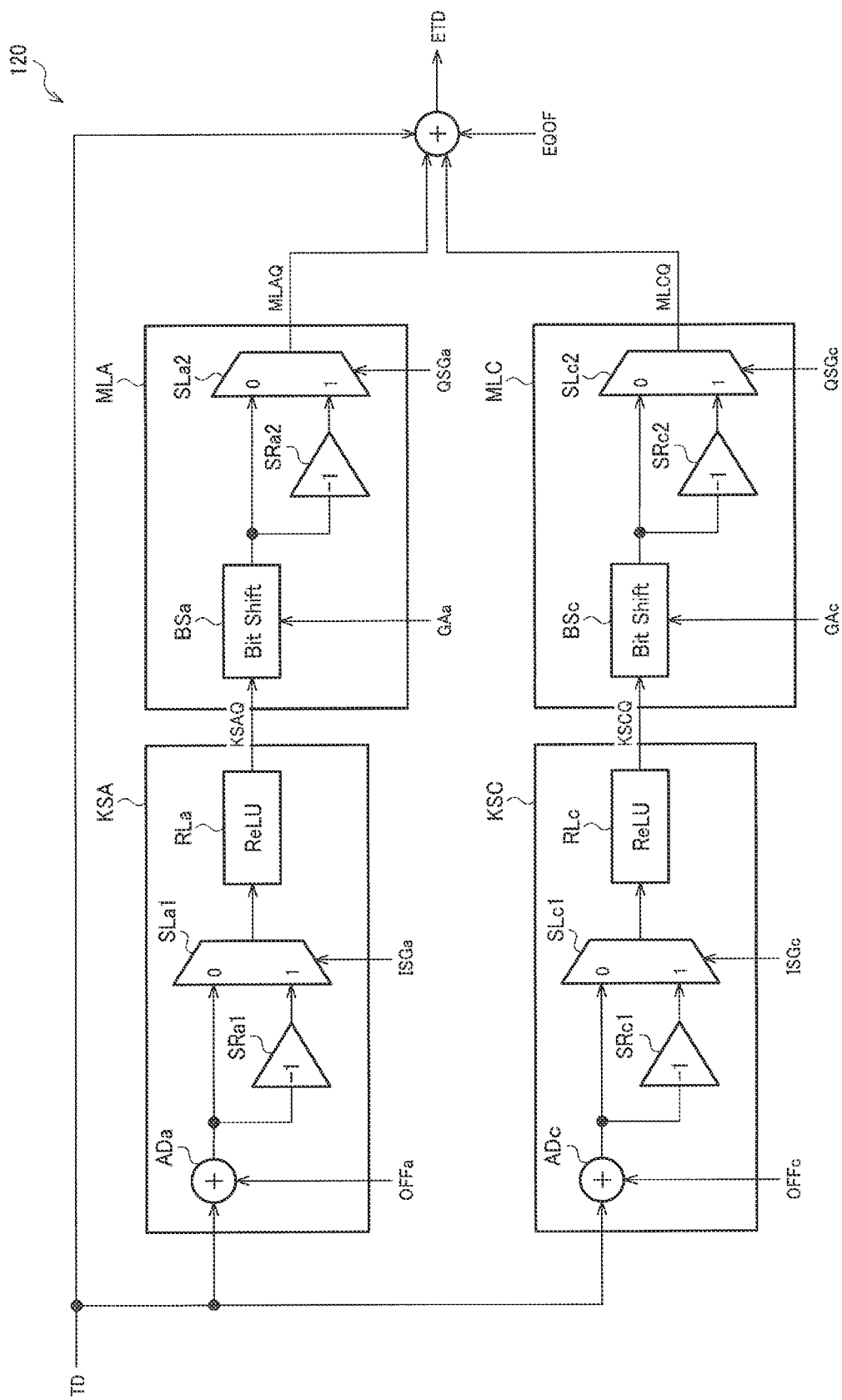
FIG. 5 illustrates a detailed configuration example of a start point setting circuit and a multiplication circuit.

FIG. 5 illustrates a detailed configuration example of the start point setting circuits KSA and KSC and the multiplication circuits MLA and MLC.

The start point setting circuit KSA includes an addition circuit ADa, a sign inversion circuit SRa1, a selector SLa1, and a ReLU circuit RLa.

The addition circuit ADa adds an offset OFFa to the temperature data TD. The sign inversion circuit SRa1 inverts a sign of output data of the addition circuit ADa. The selector SLa1 selects the output data of the addition circuit ADa when a sign selection signal ISGa is 0, and selects the output data of the sign inversion circuit SRa1 when the sign selection signal ISGa is 1. The ReLU circuit RLa outputs 0 when the output data of the selector SLa1 is smaller than 0, and outputs the data as it is when the output data of the selector SLa1 is equal to or larger than 0. The offset OFFa and the sign selection signal ISGa are stored in the register 170.

In the example of FIG. 3, the offset OFFa is set to −32 and the sign selection signal ISGa is set to 0. At this time, the output data of the addition circuit ADa is TD−32, the selector SLa1 selects TD−32, and the ReLU circuit RLa outputs KSAQ=TD−32 when TD≥32, and outputs KSAQ=0 when TD<32. The start temperature Ta of the temperature range RTA is designated by the offset OFFa=−32, and an absolute value of 32 of the offset OFFa is the temperature data corresponding to the start temperature Ta. As described above, the operation of the start point setting circuit KSA described with reference to FIG. 4 is realized.

The multiplication circuit MLA includes a bit shift circuit BSa, a sign inversion circuit SRa2, and a selector SLa2.

The bit shift circuit BSa multiplies the difference temperature data KSAQ by the gain by bit-shifting the difference temperature data KSAQ from the start point setting circuit KSA. A shift direction and a shift amount of the bit shift are designated by a bit shift value GAa. The shift direction is a LSB direction or a MSB direction, and the shift amount is the number of bits to be shifted. Gains of the bit shift are 2, 4, 8, . . . in the MSB direction and are 0.5, 0.25, 0.125, . . . in the LSB direction. When the shift amount is zero, the gain of the bit shift is 1. The sign inversion circuit SRa2 inverts a sign of output data of the bit shift circuit BSa. The selector SLa2 selects the output data of the bit shift circuit BSa when the sign selection signal QSGa is 0, and selects the output data of the sign inversion circuit SRa2 when the sign selection signal QSGa is 1. The bit shift value GAa and the sign selection signal QSGa are stored in the register 170.

In the example of FIG. 3, the shift direction of the bit shift value GAa is set to the LSB direction, and the shift amount is set to 1 bit. That is, the gain of the bit shift is 0.5. Further, the sign selection signal QSGa=0 is set. At this time, the output data of the bit shift circuit BSa is (TD−32)×0.5, and the selector SLa2 selects (TD−32)×0.5. Accordingly, MSAQ=(TD−32)×0.5 is output when TD≥32, and MSAQ=0 is output when TD<32. As described above, the operation of the multiplication circuit MLA described with reference to FIG. 4 is realized.

The start point setting circuit KSC includes an addition circuit ADc, a sign inversion circuit SRc1, a selector SLc1, and a ReLU circuit RLc. The multiplication circuit MLC includes a bit shift circuit BSc, a sign inversion circuit SRc2, and a selector SLc2. Since the operations of the start point setting circuit KSC and the multiplication circuit MLC are the same as the operations of the start point setting circuit KSA and the multiplication circuit MLA, the description thereof will be omitted and will be described only when applied to the example of FIG. 3.

In the example of FIG. 3, the offset is set to OFFc=−24 and the sign selection signal ISGc=1. At this time, the output data of the addition circuit ADc is TD−24, the selector SLc1 selects −(TD−24), and the ReLU circuit RLc outputs KSCQ=−(TD−24) when TD≤24, and outputs KSCQ=0 when TD>24. The start temperature Tc of the temperature range RTC is designated by the offset OFFc=−24, and the absolute value 24 of the offset OFFc is the temperature data corresponding to the start temperature Tc. As described above, the operation of the start point setting circuit KSC described with reference to FIG. 4 is realized.

The shift direction of the bit shift value GAc is set to the LSB direction, and the shift amount is set to 1 bit. That is, the gain of the bit shift is 0.5. The sign selection signal QSGc is set to 1. At this time, the output data of the bit shift circuit BSc is −(TD−24)×0.5, and the selector SLc2 selects (TD−24)×0.5. Accordingly, MSCQ=(TD−24)×0.5 is output when TD≤24, and MSCQ=0 is output when TD>24. As described above, the operation of the multiplication circuit MLC described with reference to FIG. 4 is realized.

In the above embodiment, the first multiplication circuit multiplies the first gain by a first bit shift with respect to the temperature data TD.

In FIG. 5, the multiplication circuit MLA corresponds to the first multiplication circuit, the bit shift performed by the bit shift circuit BSa corresponds to the first bit shift, and the gain of the bit shift designated by the bit shift value GAa corresponds to the first gain.

According to the present embodiment, an arithmetic operation load of the multiplication can be reduced by using the bit shift for the multiplication of the temperature data TD and the first gain. For example, in an oscillator such as a real-time clock device that requires low power consumption, it is possible to improve temperature compensation accuracy while suppressing an increase in power consumption.

2. Second Configuration Example

Figure 6:
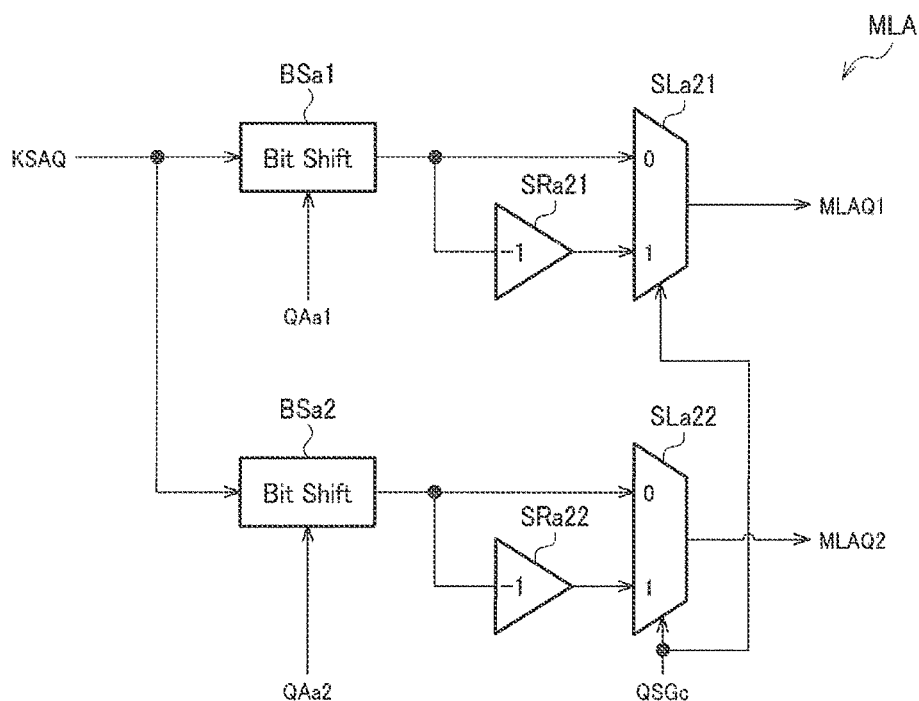
FIG. 6 illustrates a second configuration example of the multiplication circuit.

FIG. 6 illustrates a second configuration example of the multiplication circuit MLA. The multiplication circuit MLA includes bit shift circuits BSa1 and BSa2, sign inversion circuits SRa21 and SRa22, and selectors SLa21 and SLa22. The multiplication circuit MLC can also have the same configuration.

Since the operation of the constituent elements is the same as that in FIG. 5, the description thereof will be omitted. Since the gain of the bit shift circuit BSa1 and the gain of the bit shift circuit BSa2 are set independently, the coefficient to be multiplied by the temperature data TD can be set more minutely. Specifically, when it is assumed that the gain designated by the bit shift value GAa1 is Gain1 and the gain designated by the bit shift value GAa2 is Gain2, MLAQ1=±Gain1×KSAQ and MLAQ2=±Gain2×KSAQ. Since MLAQ1 and MLAQ2 are added by the addition circuit 126, MLAQ1+MLAQ2=±(Gain1+Gain2)×KSAQ. For example, when Gain1 is set to 0.5 and Gain2 is set to 0.25, Gain1+Gain2=0.75. It is possible to set a more appropriate gain according to the slope of the temperature characteristics of the oscillation frequency compared with the case of using one bit shift circuit.

3. Third Configuration Example

Figure 7:
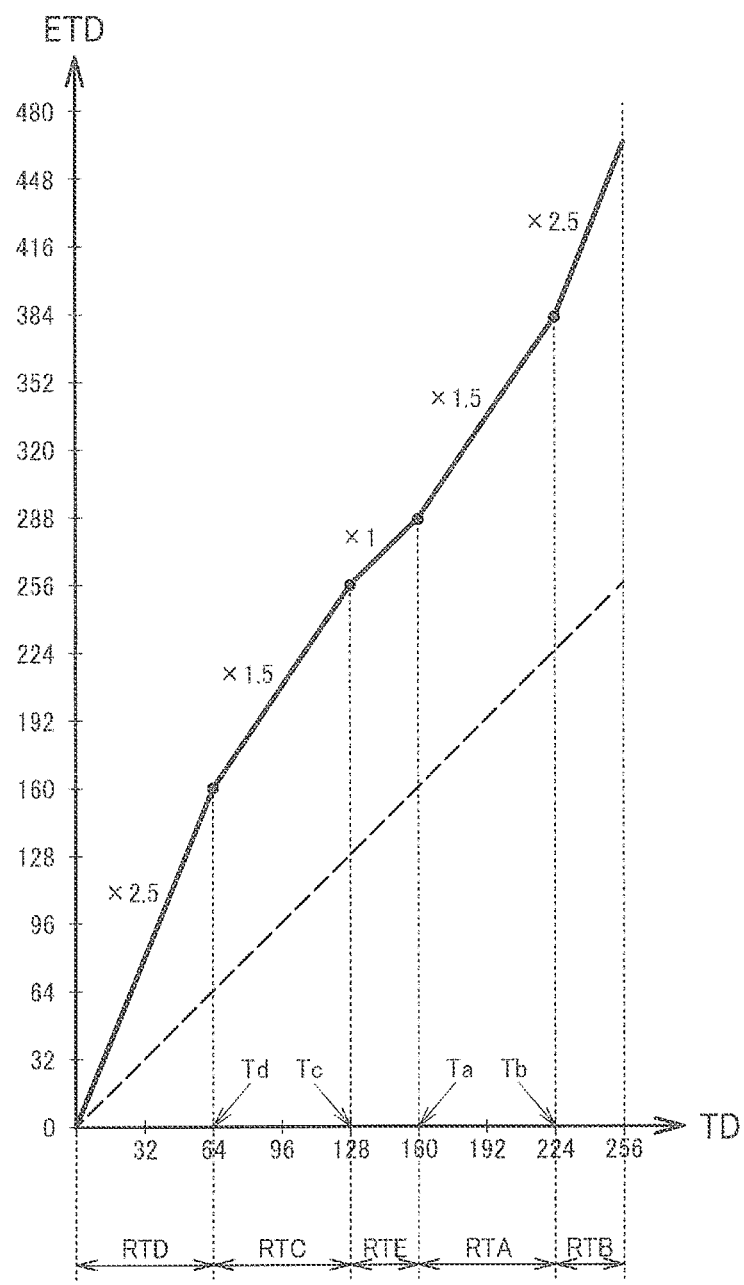
FIG. 7 illustrates an example of conversion from temperature data to converted temperature data in a third configuration example of the arithmetic operation circuit.

FIG. 7 is an example of conversion from the temperature data TD to the converted temperature data ETD in a third configuration example of the arithmetic operation circuit 120. A solid line depicts the converted temperature data ETD in the present embodiment, and a dotted line depicts the converted temperature data ETD when the temperature data TD is used as it is as the converted temperature data ETD. In FIG. 7, the temperature data TD and the converted temperature data ETD are represented by decimal numbers. The higher bit ETD [n: i+1] of the converted temperature data ETD is represented as an integer, and one integer value corresponds to one address.

In FIG. 7, as the value of the temperature data TD becomes larger, the larger value corresponds to a higher temperature, and a range of 0 to 256 of the temperature data TD corresponds to the operating temperature range of the circuit device 100. In the third configuration example, the operating temperature range is divided into temperature ranges RTD, RTC, RTE, RTA, and RTB. The temperature range RTD corresponds to the range of 0 to 64 of the temperature data TD. The temperature range RTC corresponds to the range of 64 to 128 of the temperature data TD. The temperature range RTE corresponds to the range of 128 to 160 of the temperature data TD. The temperature range RTA corresponds to the range of 160 to 224 of the temperature data TD. The temperature range RTB corresponds to the range of 224 to 256 of the temperature data TD. The temperature range RTE is near the room temperature, and is a temperature range in which the temperature sensitivity is small in terms of the temperature characteristics of the oscillation frequency. The temperature ranges RTC and RTA are temperature ranges in which the temperature sensitivity is higher than the room temperature in terms of the temperature characteristics of the oscillation frequency. The temperature ranges RTD and RTB are temperature ranges in which the temperature sensitivity is larger than that of the temperature ranges RTC and RTA in terms of the temperature characteristics of the oscillation frequency.

The arithmetic operation circuit 120 outputs the converted temperature data ETD by not changing the slope of the temperature data TD corresponding to the temperature range RTE near the room temperature and performing the offset addition processing on the temperature data TD. The arithmetic operation circuit 120 outputs the converted temperature data ETD by multiplying the slopes of the pieces of temperature data TD corresponding to the temperature ranges RTC and RTA by 1.5 and performing the offset addition processing. The arithmetic operation circuit 120 outputs the converted temperature data ETD by multiplying the slopes of the pieces of temperature data TD corresponding to the temperature ranges RTD and RTB by 2.5 and performing the offset addition processing. The offset value is set such that the lower limit of the converted temperature data ETD in the operating temperature range does not become negative. In FIG. 7, the offset value is set such that the lower limit of the converted temperature data ETD becomes zero, but the offset value may be set such that the lower limit of the converted temperature data ETD becomes larger than zero.

Figure 8:
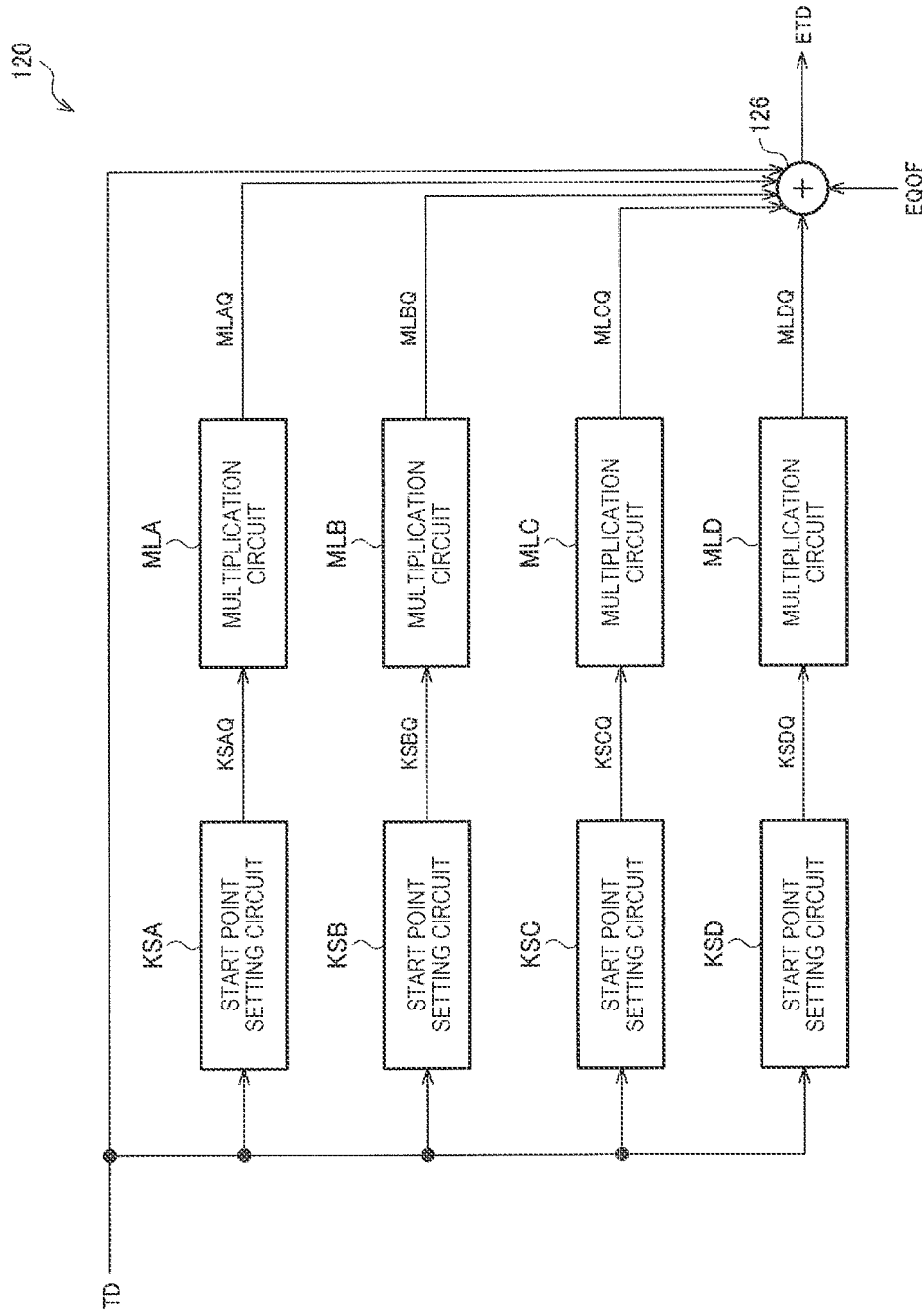
FIG. 8 illustrates the third configuration example of the arithmetic operation circuit.

FIG. 8 illustrates the third configuration example of the arithmetic operation circuit 120 that performs the conversion of FIG. 7. The arithmetic operation circuit 120 includes start point setting circuits KSA to KSD, multiplication circuits MLA to MLD, and addition circuit 126. The detailed configuration of the start point setting circuits KSA to KSD is the same as that of the start point setting circuits KSA and KSC in FIG. 5. The detailed configuration of the multiplication circuits MLA to MLD is the same as that of the multiplication circuits MLA and MLC of FIG. 5 or the multiplication circuit MLA of FIG. 6.

The start point setting circuit KSA sets a start temperature Ta of the temperature range RTA of FIG. 7. The start temperature Ta is a boundary between the adjacent temperature ranges RTE and RTA, and is a lower limit of the temperature range RTA. Specifically, the start temperature Ta is set by the temperature data TD=160 corresponding to the start temperature Ta. The start point setting circuit KSA outputs the difference temperature data KSAQ=TD−160 when TD is equal to or larger than 160, and outputs the difference temperature data KSAQ=0 when the temperature data TD is smaller than 160. The multiplication circuit MLA outputs output data MLAQ=(TD−160)×0.5 obtained by multiplying the difference temperature data KSAQ by a gain of 0.5. MLAQ=0 when TD<160.

The start point setting circuit KSB sets a start temperature Tb of the temperature range RTB of FIG. 7. The start temperature Tb is a boundary between the adjacent temperature ranges RTA and RTB, and is a lower limit of the temperature range RTB. Specifically, the start temperature Tb is set by the temperature data TD=224 corresponding to the start temperature Tb. The start point setting circuit KSB outputs the difference temperature data KSBQ=TD−224 when TD is equal to or larger than 224, and outputs the difference temperature data KSBQ=0 when the temperature data TD is smaller than 224. The multiplication circuit MLB outputs the output data MLBQ=(TD−224)×1 obtained by multiplying the difference temperature data KSBQ by a gain of 1. MLBQ=0 when TD<224.

The start point setting circuit KSC sets a start temperature Tc of the temperature range RTC of FIG. 7. The start temperature Tc is a boundary between the adjacent temperature ranges RTE and RTC, and is an upper limit of the temperature range RTC. Specifically, the start temperature Tc is set by the temperature data TD=128 corresponding to the start temperature Tc. The start point setting circuit KSC outputs the difference temperature data KSCQ=−(TD−128) in which 128 is subtracted from the temperature data TD and a sign is inverted when the temperature data TD is equal to or less than 128, and outputs the difference temperature data KSCQ=0 when the temperature data TD is larger than 128. The multiplication circuit MLC outputs the output data MLCQ=(TD−128)×0.5 in which the difference temperature data KSCQ is multiplied by the gain of 0.5 and a sign is inverted. MLCQ=0 when TD>128.

The start point setting circuit KSD sets a start temperature Td of the temperature range RTD of FIG. 7. The start temperature Td is a boundary between the adjacent temperature ranges RTC and RTD, and is an upper limit of the temperature range RTD. Specifically, the start temperature Td is set by the temperature data TD=64 corresponding to the start temperature Td. The start point setting circuit KSD outputs the difference temperature data KSDQ=−(TD−64) in which 64 is subtracted from the temperature data TD and a sign is inverted when the temperature data TD is equal to or less than 64, and outputs the difference temperature data KSDQ=0 when the temperature data TD is larger than 64. The multiplication circuit MLD outputs the output data MLDQ=(TD−64)×1 in which the difference temperature data KSDQ is multiplied by the gain of 1 and a sign is inverted. MLDQ=0 when TD>64.

The addition circuit 126 adds the temperature data TD, the output data MLAQ, the output data MLBQ, the output data MLCQ, the output data MLDQ, and the offset value EQOF, and outputs the result as the converted temperature data ETD. In the temperature range RTE, ETD=TD+EQOF, and the slope of the converted temperature data ETD is 1. In the temperature range RTA, ETD=TD+(TD−160)×0.5+EQOF=1.5×TD−80+EQOF, and in the temperature range RTC, ETD=TD+(TD−128)×0.5+EQOF=1.5×TD−64+EQOF. Since a coefficient of the temperature data TD is 1.5 obtained by adding 1 to the gain of 0.5, the slope of the converted temperature data ETD is 1.5. In the temperature range RTB, ETD=TD+(TD−160)×0.5+(TD−224)×1+EQOF=2.5×TD−304+EQOF, and in the temperature range RTD, ETD=TD+(TD−128)×0.5+(TD−64)×1+EQOF=2.5×TD−128+EQOF. Since a coefficient of the temperature data TD is 2.5 obtained by adding 1 to the gain of 0.5 and the gain of 1, the slope of the converted temperature data ETD is 2.5.

In the present embodiment, the arithmetic operation circuit 120 multiplies the temperature data TD of the first temperature range by the first coefficient, and multiplies the temperature data TD of the second temperature range by a second coefficient different from the first coefficient.

In the example of FIG. 7, the temperature range RTA corresponds to the first temperature range, and the temperature range RTB corresponds to the second temperature range. Alternatively, the temperature range RTC corresponds to the first temperature range, and the temperature range RTD corresponds to the second temperature range. As described with reference to FIG. 8, the arithmetic operation circuit 120 multiplies the pieces of temperature data TDs of the temperature ranges RTA and RTC by a coefficient of 1.5, and multiplies the pieces of temperature data TD of the temperature ranges RTB and RTD by a coefficient of 2.5. In this example, the coefficient of 1.5 corresponds to the first coefficient, and the coefficient of 2.5 corresponds to the second coefficient.

According to the present embodiment, the slope of the converted temperature data ETD in the first temperature range is set by the first coefficient, and the slope of the converted temperature data ETD in the second temperature range is set by the second coefficient. Accordingly, the arithmetic operation circuit 120 can execute the conversion processing in which the slope of the converted temperature data ETD in the first temperature range is different from the slope of the converted temperature data ETD in the second temperature range.

In the present embodiment, the absolute value of the slope of the frequency-temperature characteristics of the vibrator 10 in the second temperature range is larger than the absolute value of the slope of the frequency-temperature characteristics in the first temperature range. At this time, the second coefficient is larger than the first coefficient.

The temperature range RTE in FIG. 7 corresponds to a range near the room temperature in which the absolute value of the slope of the frequency-temperature characteristics is small in FIG. 1. The temperature range RTA or RTC corresponding to the first temperature range corresponds to the temperature range in which the absolute value of the slope of the frequency-temperature characteristics is larger than the range near the room temperature, and the temperature range RTB or RTD corresponding to the second temperature range corresponds the temperature range in which the absolute value of the slope of the frequency-temperature characteristics is even larger than the temperature range RTA or RTC.

According to the present embodiment, the temperature data TD of the first temperature range is multiplied by the first coefficient, and the temperature data TD of the second temperature range in which the absolute value of the slope of the frequency-temperature characteristics is larger than the first temperature range is multiplied by the second coefficient larger than the first coefficient. Accordingly, as the absolute value of the slope of the frequency-temperature characteristics becomes larger in the temperature range, the address allocation of the lookup table 131 can be increased.

In the present embodiment, the second temperature range is a temperature range adjacent to the first temperature range and higher than the first temperature range. The arithmetic operation circuit 120 includes the first start point setting circuit that sets the first start temperature of the first temperature range, the first multiplication circuit that multiplies first difference temperature data indicating an increase in the temperature data TD with respect to the temperature data TD at the first start temperature by the first gain, the second start point setting circuit that sets the second start temperature of the second temperature range, the second multiplication circuit that multiplies second difference temperature data indicating an increase in the temperature data TD with respect to the temperature data TD at the second start temperature by the second gain, and the addition circuit that adds the temperature data TD, the output of the first multiplication circuit, and the output of the second multiplication circuit.

In the example of FIG. 7, the temperature range RTA corresponds to the first temperature range, the temperature range RTB corresponds to the second temperature range, the start temperature Ta corresponds to the first start temperature, and the start temperature Tb corresponds to the second start temperature. TD=160 corresponds to the temperature data TD at the first start temperature, and TD=224 corresponds to the temperature data TD at the second start temperature. In FIG. 8, the start point setting circuit KSA corresponds to the first start point setting circuit, the multiplication circuit MLA corresponds to the first multiplication circuit, the start point setting circuit KSB corresponds to the second start point setting circuit, and the multiplication circuit MLB corresponds to the second multiplication circuit. The difference temperature data KSAQ corresponds to the first difference temperature data, and the difference temperature data KSBQ corresponds to the second difference temperature data. The gain of 0.5 to be multiplied by the multiplication circuit MLA corresponds to the first gain, and the gain of 1 to be multiplied by the multiplication circuit MLB corresponds to the second gain.

According to the present embodiment, a case where the temperature data TD corresponding to the temperature higher than the first start temperature and lower than the second temperature is multiplied by the first gain and the result and the temperature data TD are added is equivalent to a case where the temperature data TD of the first temperature range is multiplied by the first coefficient. That is, the first coefficient is a value obtained by adding 1 to the first gain. A case where the temperature data TD corresponding to the temperature higher than the second temperature is multiplied by the first gain and the second gain and the result and the temperature data TD are added is equivalent to a case where the temperature data TD of the second temperature range is multiplied by the second coefficient. That is, the second coefficient is a value obtained by adding the first gain, the second gain, and 1.

In the present embodiment, the first multiplication circuit multiplies the first gain by the first bit shift. The second multiplication circuit multiplies the second gain by the second bit shift.

In FIG. 8, the multiplication circuit MLA includes a bit shift circuit, the bit shift performed by the bit shift circuit corresponds to the first bit shift, and the gain of the bit shift corresponds to the first gain. The multiplication circuit MLB includes a bit shift circuit, the bit shift performed by the bit shift circuit corresponds to the second bit shift, and the gain of the bit shift corresponds to the second gain.

According to the present embodiment, an arithmetic operation load of the multiplication can be reduced by using the bit shift for the multiplication of the temperature data TD and the first gain and the multiplication of the temperature data TD and the second gain. For example, in an oscillator such as a real-time clock device that requires low power consumption, it is possible to improve temperature compensation accuracy while suppressing an increase in power consumption.

4. Temperature Sensor Circuit

Figure 9:
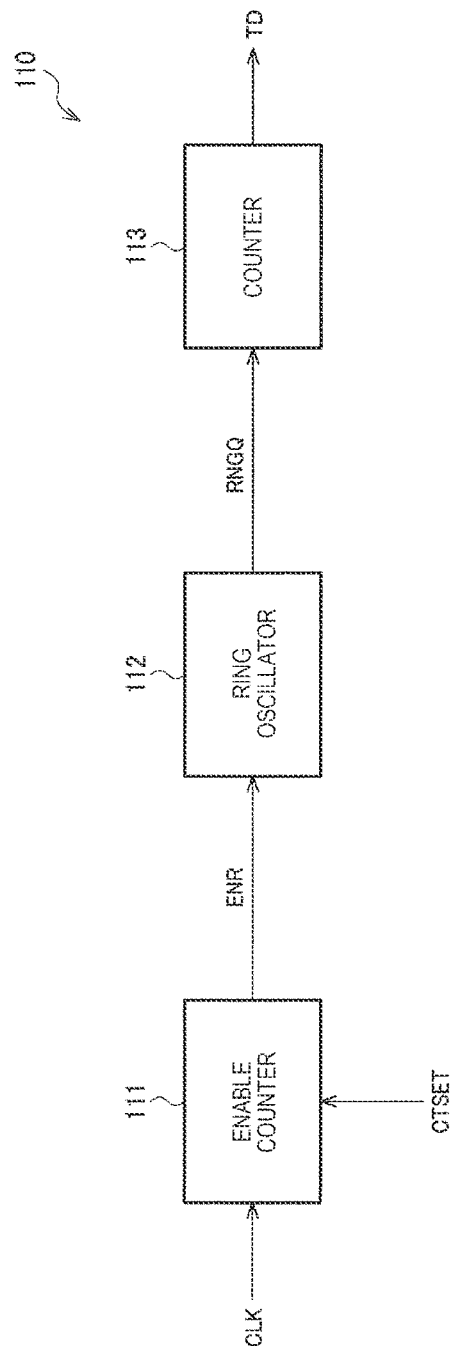
FIG. 9 illustrates a detailed configuration example of a temperature sensor circuit.

FIG. 9 is a detailed configuration example of the temperature sensor circuit 110. The temperature sensor circuit 110 includes an enable counter 111, a ring oscillator 112, and a counter 113.

The enable counter 111 outputs an enable signal ENR that becomes active in an enable period based on the clock signal CLK output by the oscillation circuit 160. Specifically, the enable counter 111 sets the enable signal ENR from an inactive state to an active state at the start of counting, counts the number of clocks of the clock signal CLK, and sets the enable signal ENR from an active state to an inactive state when the count value reaches a set value CTSET. The set value CTSET is stored in, for example, the register 170 of FIG. 2, and a detection resolution of the temperature sensor circuit 110 can be changed by changing the set value CTSET.

The ring oscillator 112 oscillates in the enable period, and outputs an oscillation signal RNGQ. The ring oscillator 112 includes, for example, a NAND circuit and an even number of inverters coupled in series between an output of the NAND circuit and a first input. The enable signal ENR is input to a second input of the NAND circuit. In this case, a high level corresponds to the active state, and the ring oscillator 112 oscillates when the enable signal ENR is the high level, and the ring oscillator 112 stops oscillating when the enable signal ENR is a low level. The above configuration is an example, and the configuration of the ring oscillator 112 is not limited to the above.

The counter 113 performs a counting operation based on the oscillation signal RNGQ of the ring oscillator 112, and outputs the temperature data TD based on the count value. Specifically, the counter 113 counts the number of pulses of the oscillation signal RNGQ output in the enable period, and outputs the count value as the temperature data TD. The counter 113 may perform the counting operation based on the oscillation signal RNGQ, and may count, for example, the number of pulses of a signal obtained by dividing the oscillation signal RNGQ. The counter 113 may output the temperature data TD based on the count value, and may output the temperature data TD by, for example, smoothing the count value.

The temperature sensor circuit 110 measures the temperature intermittently by an intermittent operation. Specifically, enable periods and disable periods are set alternately, and the temperature sensor circuit 110 outputs the temperature data TD measured in each enable period. The disable period is a period during which the enable signal ENR is inactive. A length of the disable period is, for example, sufficiently longer than the enable period. The temperature sensor circuit 110 may continuously measure the temperature. For example, the ring oscillator 112 may oscillate continuously, the counter 113 may be reset for each predetermined period defined by the clock signal CLK, and may output, as the temperature data, the count value in each predetermined period.

The temperature sensor circuit 110 is constituted by using the ring oscillator 112 as described above, and thus, power consumption and a layout area can be reduced as compared with the temperature sensor circuit using the analog temperature sensor and the A/D converter described above.

In the temperature sensor circuit using the analog temperature sensor and the A/D converter, it is necessary to reduce noise of the analog temperature sensor or increase a resolution of the A/D converter in order to increase the detection resolution. In this respect, according to the present embodiment, it is possible to increase the detection resolution by merely lengthening the enable period.

It is possible to further reduce the power consumption of the temperature sensor circuit 110 by intermittently operating the temperature sensor circuit 110.

5. Oscillation Circuit and Frequency Adjustment Circuit

Figure 10:
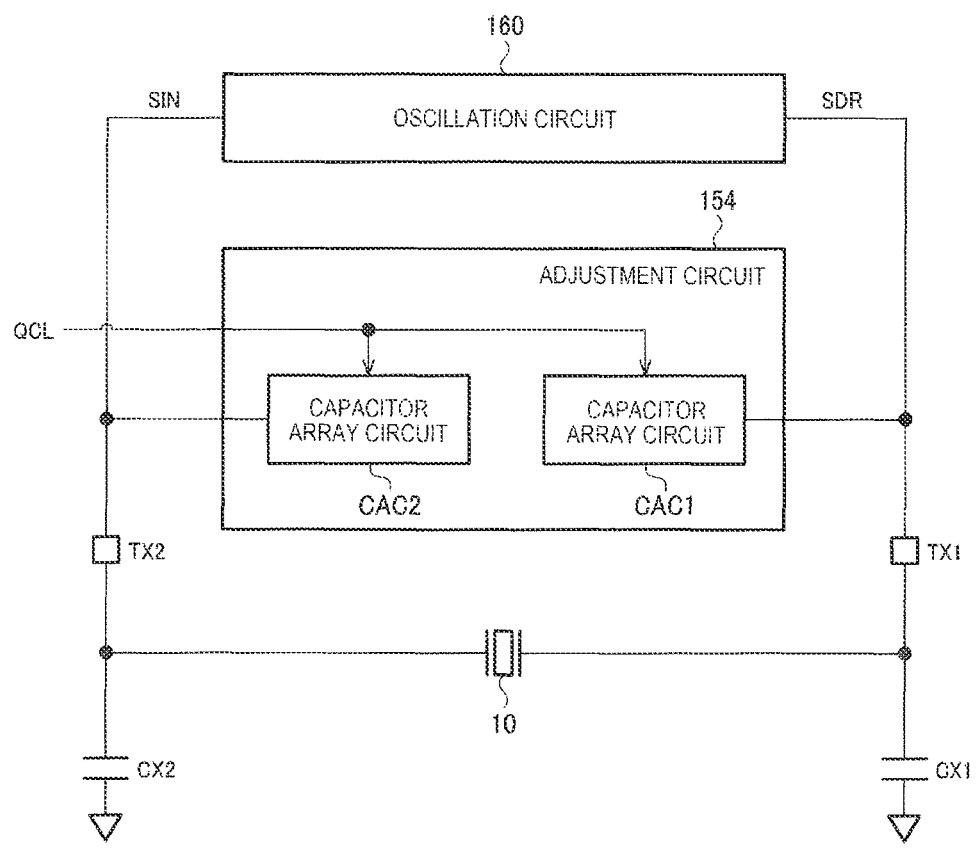
FIG. 10 illustrates a detailed configuration example of an adjustment circuit and a coupling configuration example of a vibrator, an oscillation circuit, and the adjustment circuit.

FIG. 10 illustrates a detailed configuration example of the adjustment circuit 154 included in the frequency adjustment circuit 150, and a coupling configuration example of the vibrator 10, the oscillation circuit 160, and the adjustment circuit 154. The adjustment circuit 154 includes capacitor array circuits CAC1 and CAC2.

One end of the vibrator 10 is coupled to a terminal TX1, and the other end of the vibrator 10 is coupled to a terminal TX2. The terminals TX1 and TX2 are terminals of the circuit device 100, and are, for example, pads provided on a semiconductor substrate. One end of a capacitor CX1 is coupled to the terminal TX1, and the other end of the capacitor CX1 is coupled to a ground node. One end of a capacitor CX2 is coupled to the terminal TX2, and the other end of the capacitor CX2 is coupled to a ground node. The capacitors CX1 and CX2 are provided, for example, as external components of the circuit device 100.

The oscillation circuit 160 generates a drive signal SDR by inverting and amplifying a signal SIN input from the other end of the vibrator 10 via the terminal TX2, and outputs the drive signal SDR to one end of the vibrator 10 via the terminal TX1. The oscillation circuit 160 is, for example, an inverter, and an input node of the inverter is coupled to the terminal TX2 and an output node is coupled to the terminal TX1. However, the oscillation circuit 160 is not limited thereto, and may be various amplifier circuits such as an amplifier circuit using a bipolar transistor. Although the oscillation signal is, for example, the drive signal SDR, the oscillation signal is not limited thereto, and the oscillation signal may be a signal in an oscillation loop including the oscillation circuit 160 and the vibrator 10. The drive signal SDR may be output as the clock signal CLK of FIG. 2, and the circuit device 100 may include an output circuit that outputs the clock signal CLK by buffering or dividing the drive signal SDR.

The capacitor array circuit CAC1 is coupled to the terminal TX1, and the capacitor array circuit CAC2 is coupled to the terminal TX2. Hereinafter, the configuration will be described by using the capacitor array circuit CAC1 as an example, but the capacitor array circuit CAC2 also has the same configuration.

The capacitor array circuit CAC1 includes first to m-th capacitors and first to m-th switches. m is an integer of 2 or more. The j-th capacitor and the j-th switch are coupled in series between the terminal TX1 and the ground node. j=1, 2, . . . , and m. Each of the first to m-th switches is controlled to be turned on or off by the adjustment data QCL from the interpolation circuit 152. Accordingly, a capacitance value of the capacitor array circuit CAC1 is controlled according to the adjustment data QCL, and the oscillation frequency is adjusted.

The circuit device of the present embodiment described above includes an oscillation circuit that generates an oscillation signal by using a vibrator, a frequency adjustment circuit that adjusts an oscillation frequency of the oscillation circuit based on frequency adjustment data, a temperature sensor circuit that outputs temperature data, an arithmetic operation circuit, and a storage circuit. The arithmetic operation circuit outputs converted temperature data by performing, on the temperature data, conversion processing in which a slope of the converted temperature data with respect to the temperature data in a first temperature range is different from a slope of the converted temperature data with respect to the temperature data in a second temperature range. The storage circuit stores a lookup table representing a correspondence between the converted temperature data and the frequency adjustment data.

According to the present embodiment, the temperature data is converted into the converted temperature data such that the slope of the converted temperature data differs depending on the temperature range. Accordingly, it is possible to adjust the slope of the converted temperature data according to the temperature sensitivity in the temperature characteristics of the oscillation frequency. Since the address of the lookup table is designated by the converted temperature data, as the slope of the converted temperature data becomes larger, the number of addresses per unit temperature becomes larger. Accordingly, highly accurate temperature compensation can be realized while efficiently utilizing a memory having a finite capacity.

In the present embodiment, the arithmetic operation circuit may output the converted temperature data such that the number of pieces of data per unit temperature of the frequency adjustment data output from the lookup table by the converted temperature data corresponding to the first temperature range is different from the number of pieces of data per unit temperature of the frequency adjustment data output from the lookup table by the converted temperature data corresponding to the second temperature range.

As the number of pieces of data per unit temperature becomes larger, the frequency adjustment data is stored in the lookup table in smaller temperature increments. Thus, highly accurate temperature compensation can be performed even in the temperature range in which the temperature sensitivity is high. On the other hand, as the number of pieces of data per unit temperature becomes smaller, the frequency adjustment data is stored in the lookup table in larger temperature increments. Thus, the utilization efficiency of the memory is improved in the temperature range in which the temperature sensitivity is small.

In the present embodiment, the arithmetic operation circuit may multiply the temperature data of the first temperature range by a first coefficient, and may not multiply the temperature data of the second temperature range by a coefficient.

According to the present embodiment, the slope of the converted temperature data in the first temperature range is set by the first coefficient, and the slope of the converted temperature data in the second temperature range is 1. Accordingly, the arithmetic operation circuit can execute the conversion processing in which the slope of the converted temperature data in the first temperature range is different from the slope of the converted temperature data in the second temperature range.

In the present embodiment, an absolute value of a slope of frequency-temperature characteristics of the vibrator in the first temperature range may be larger than an absolute value of a slope of frequency-temperature characteristics in the second temperature range. The first coefficient may be larger than 1.

According to the present embodiment, the temperature data of the first temperature range in which the absolute value of the slope of the frequency-temperature characteristics is large is multiplied by the first coefficient larger than 1, the absolute value of the slope of the converted temperature data of the first temperature range is larger than 1. Accordingly, the address allocation of the lookup table can be increased in the temperature range in which the absolute value of the slope of the frequency-temperature characteristics is large.

In the present embodiment, the first temperature range may be a temperature range adjacent to the second temperature range and higher than the second temperature range. The arithmetic operation circuit may include a first start point setting circuit that sets a first start temperature of the first temperature range, a first multiplication circuit that multiplies difference temperature data indicating an increase in the temperature data with respect to the temperature data at the first start temperature by a first gain, and an addition circuit that adds the temperature data and an output of the first multiplication circuit.

According to the present embodiment, a case where the temperature data corresponding to the temperature higher than the first start temperature is multiplied by the first gain and the temperature data is added to the multiplied data is equivalent to a case where the temperature data of the first temperature range is multiplied by the first coefficient. That is, the first coefficient is a value obtained by adding 1 to the first gain. Since the temperature data of the second temperature range is merely output as the converted temperature data from the addition circuit, the temperature data of the second temperature range is not multiplied by the coefficient.

In the present embodiment, the first multiplication circuit may multiply by the first gain by a first bit shift for the temperature data.

According to the present embodiment, an arithmetic operation load of the multiplication can be reduced by using the bit shift for the multiplication of the temperature data and the first gain. Accordingly, it is possible to improve the temperature compensation accuracy while suppressing an increase in power consumption.

In the present embodiment, the arithmetic operation circuit may multiply the temperature data of the first temperature range by a first coefficient, and multiplies the temperature data of the second temperature range by a second coefficient different from the first coefficient.

According to the present embodiment, the slope of the converted temperature data in the first temperature range is set by the first coefficient, and the slope of the converted temperature data in the second temperature range is set by the second coefficient. Accordingly, the arithmetic operation circuit can execute the conversion processing in which the slope of the converted temperature data in the first temperature range is different from the slope of the converted temperature data in the second temperature range.

In the present embodiment, an absolute value of a slope of frequency-temperature characteristics of the vibrator in the second temperature range may be larger than an absolute value of a slope of the frequency-temperature characteristics in the first temperature range. The second coefficient may be larger than the first coefficient.

According to the present embodiment, the temperature data of the first temperature range is multiplied by the first coefficient, and the temperature data of the second temperature range in which the absolute value of the slope of the frequency-temperature characteristics is larger than the first temperature range is multiplied by the second coefficient larger than the first coefficient. Accordingly, as the absolute value of the slope of the frequency-temperature characteristics becomes larger in the temperature range, the address allocation of the lookup table can be increased.

In the present embodiment, the second temperature range may be a temperature range adjacent to the first temperature range and higher than the first temperature range. The arithmetic operation circuit may include a first start point setting circuit that sets a first start temperature of the first temperature range, and a first multiplication circuit that multiplies first difference temperature data indicating an increase in the temperature data with respect to the temperature data at the first start temperature by a first gain. The arithmetic operation circuit may include a second start point setting circuit that sets a second start temperature of the second temperature range, and a second multiplication circuit that multiplies second difference temperature data indicating an increase in the temperature data with respect to the temperature data at the second start temperature by a second gain. The arithmetic operation circuit may include an addition circuit that adds the temperature data, an output of the first multiplication circuit, and an output of the second multiplication circuit.

According to the present embodiment, a case where the temperature data corresponding to the temperature higher than the first start temperature and lower than the second temperature is multiplied by the first gain and the result and the temperature data are added is equivalent to a case where the temperature data of the first temperature range is multiplied by the first coefficient. That is, the first coefficient is a value obtained by adding 1 to the first gain. A case where the temperature data corresponding to the temperature higher than the second temperature is multiplied by the first gain and the second gain and the result and the temperature data are added is equivalent to a case where the temperature data of the second temperature range is multiplied by the second coefficient. That is, the second coefficient is a value obtained by adding the first gain, the second gain, and 1.

In the present embodiment, the first multiplication circuit may multiply the first gain by a first bit shift for the temperature data. The second multiplication circuit may multiply the second gain by a second bit shift for the temperature data.

According to the present embodiment, an arithmetic operation load of the multiplication can be reduced by using the bit shift for the multiplication of the temperature data and the first gain and the multiplication of the temperature data and the second gain. Accordingly, it is possible to improve the temperature compensation accuracy while suppressing an increase in power consumption.

In the present embodiment, the temperature sensor circuit may include a ring oscillator and a counter. The counter may perform a counting operation based on an oscillation signal of the ring oscillator, and may output the temperature data based on a count value.

According to the present embodiment, power consumption and a layout area can be reduced as compared with the temperature sensor circuit using the analog temperature sensor and the A/D converter. Since the detection resolution can be increased by merely lengthening the enable period, the detection resolution can be improved by a simple method as compared with the temperature sensor circuit using the analog temperature sensor and the A/D converter.

An oscillator of the present embodiment includes the above-described circuit device and the vibrator.

Although the present embodiment has been described in detail as described above, those skilled in the art can easily understand that many modifications without substantially departing from new matters and effects of the present disclosure can be made. Accordingly, all such modification examples are included in the scope of the present disclosure. For example, a term described at least once in the specification or drawings together with a different term in a broader or synonymous manner may be replaced by the different term in any location in the specification or drawings. All combinations of the present embodiment and modification examples are also included in the scope of the present disclosure. The configuration and operation of the circuit device, the oscillator, the vibrator, and the like are not limited to those described in the present embodiment, and various modifications can be performed.

What is claimed is:

1. A circuit device comprising:
an oscillation circuit that generates an oscillation signal by using a vibrator;
a frequency adjustment circuit that adjusts an oscillation frequency of the oscillation circuit based on frequency adjustment data;
a temperature sensor circuit that outputs temperature data;
an arithmetic operation circuit that outputs converted temperature data by performing, on the temperature data, conversion processing in which a slope of the converted temperature data with respect to the temperature data in a first temperature range is different from a slope of the converted temperature data with respect to the temperature data in a second temperature range; and
a storage circuit that stores a lookup table representing a correspondence between the converted temperature data and the frequency adjustment data.

2. The circuit device according to claim 1, wherein
the arithmetic operation circuit outputs the converted temperature data such that the number of pieces of data per unit temperature of the frequency adjustment data output from the lookup table by the converted temperature data corresponding to the first temperature range is different from the number of pieces of data per unit temperature of the frequency adjustment data output from the lookup table by the converted temperature data corresponding to the second temperature range.

3. The circuit device according to claim 1, wherein
the arithmetic operation circuit multiplies the temperature data of the first temperature range by a first coefficient, and does not multiply the temperature data of the second temperature range by a coefficient.

4. The circuit device according to claim 3, wherein
an absolute value of a slope of frequency-temperature characteristics of the vibrator in the first temperature range is larger than an absolute value of a slope of frequency-temperature characteristics in the second temperature range, and
the first coefficient is larger than 1.

5. The circuit device according to claim 3, wherein
the first temperature range is a temperature range adjacent to the second temperature range and higher than the second temperature range, and
the arithmetic operation circuit includes a first start point setting circuit that sets a first start temperature of the first temperature range,
a first multiplication circuit that multiplies difference temperature data indicating an increase in the temperature data with respect to the temperature data at the first start temperature by a first gain, and
an addition circuit that adds the temperature data and an output of the first multiplication circuit.

6. The circuit device according to claim 5, wherein
the first multiplication circuit multiplies by the first gain by a first bit shift for the temperature data.

7. The circuit device according to claim 1, wherein
the arithmetic operation circuit multiplies the temperature data of the first temperature range by a first coefficient, and multiplies the temperature data of the second temperature range by a second coefficient different from the first coefficient.

8. The circuit device according to claim 7, wherein
an absolute value of a slope of frequency-temperature characteristics of the vibrator in the second temperature range is larger than an absolute value of a slope of the frequency-temperature characteristics in the first temperature range, and
the second coefficient is larger than the first coefficient.

9. The circuit device according to claim 7, wherein the second temperature range is a temperature range adjacent to the first temperature range and higher than the first temperature range, and
the arithmetic operation circuit includes
a first start point setting circuit that sets a first start temperature of the first temperature range,
a first multiplication circuit that multiplies first difference temperature data indicating an increase in the temperature data with respect to the temperature data at the first start temperature by a first gain,
a second start point setting circuit that sets a second start temperature of the second temperature range,
a second multiplication circuit that multiplies second difference temperature data indicating an increase in the temperature data with respect to the temperature data at the second start temperature by a second gain, and
an addition circuit that adds the temperature data, an output of the first multiplication circuit, and an output of the second multiplication circuit.

10. The circuit device according to claim 9, wherein
the first multiplication circuit multiplies the first gain by a first bit shift for the temperature data, and
the second multiplication circuit multiplies the second gain by a second bit shift for the temperature data.

11. The circuit device according to claim 1, wherein
the temperature sensor circuit includes
a ring oscillator, and
a counter that performs a counting operation based on an oscillation signal of the ring oscillator, and outputs the temperature data based on a count value.

12. An oscillator comprising:
the circuit device according to claim 1; and
the vibrator.

* * * * *